United States Patent [19]
Fulcomer

[11] Patent Number: 5,565,803
[45] Date of Patent: Oct. 15, 1996

[54] DIGITAL INPUT THRESHOLD SWITCHING CIRCUIT

[75] Inventor: James L. Fulcomer, Manhattan Beach, Calif.

[73] Assignee: Hughes Aircraft Company, Los Angeles, Calif.

[21] Appl. No.: 455,370

[22] Filed: May 31, 1995

[51] Int. Cl.$^6$ ................................................. H03K 17/00
[52] U.S. Cl. ............................ 327/99; 327/205; 326/22
[58] Field of Search ........................... 327/99, 205, 175; 326/22, 83

[56] References Cited

U.S. PATENT DOCUMENTS

| 4,529,892 | 7/1985 | Reilly et al. | 327/205 |
| 5,418,409 | 5/1995 | Kuhn | 327/205 |

FOREIGN PATENT DOCUMENTS

| 2081585-A | 4/1993 | Canada. | |
| 59-58910(A) | 4/1984 | Japan | 327/205 |
| 59-125118(A) | 7/1984 | Japan | 327/205 |

*Primary Examiner*—Timothy P. Callahan
*Assistant Examiner*—Jung Ho Kim
*Attorney, Agent, or Firm*—Leonard A. Alkov; Wanda K. Denson-Low

[57] ABSTRACT

A digital input circuit including a first digital buffer for receiving a digital data signal and for providing a first buffered digital data output, the first digital buffer having a first switching threshold voltage; a second digital buffer for receiving the digital data signal and for providing a second buffered digital data output, the second digital buffer having a second switching threshold voltage that is greater than the first predetermined switching threshold voltage; a selection circuit responsive to the first buffered digital data output and the second buffered digital data output for providing a selection circuit output that is a replica of the first buffered digital data output or the second buffered digital data output; and a flip-flop for receiving the selection means output and providing a flip-flop output that is indicative of the logical state of the digital data signal. The selection circuit is controlled by the output of the flip-flop such that the selection circuit output is a replica of the first buffered digital data output when the flip-flop output indicates that the digital data signal is of a first state that is represented by a first predetermined voltage, and such that the selection circuit output is a replica of the second buffered digital data output when the flip-flop output indicates that the digital data signal is of a second state that is represented by a second predetermined voltage that is greater than the first predetermined voltage.

7 Claims, 1 Drawing Sheet

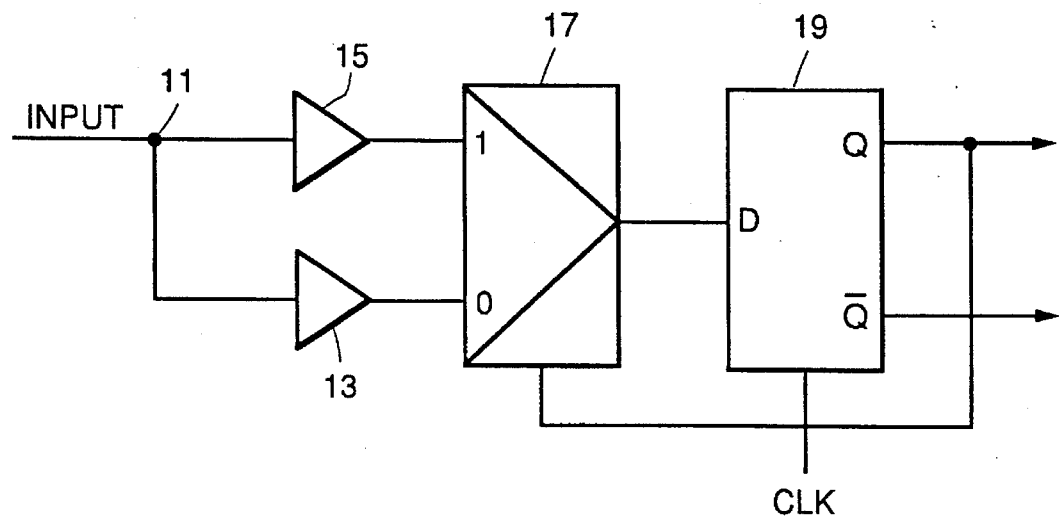
FIG. 1.
FIG. 2.
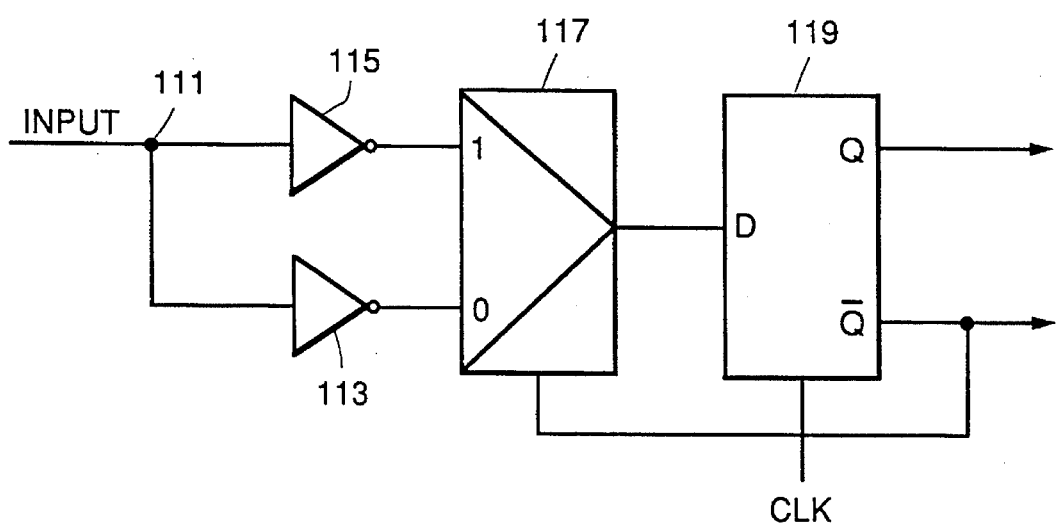

DIGITAL INPUT THRESHOLD SWITCHING CIRCUIT

BACKGROUND OF THE INVENTION

The disclosed invention is directed to a digital input threshold switching circuit having an adaptive switching threshold that changes as a function of the logical state of the most recently received digital input signal.

In digital systems, information is transferred in the form of digital signals that are provided by driver circuits whose outputs are electrically connected to receiver circuits. A consideration with the implementation of driver circuits is the need to insure that signal reflections and other transmission line effects do not prevent complete switching at a receiver within system timing requirements. This is typically achieved by using stronger driver circuits that have greater current driving capabilities. However, stronger driver circuits consume more power and induce more noise.

SUMMARY OF THE INVENTION

It would therefore be an advantage to provide a digital input threshold switching circuit that allows for use of reduced strength driver circuits without sacrificing signal switching speed and without reducing protection against noise.

The foregoing and other advantages are provided by the invention in a digital input threshold switching circuit that includes a first digital buffer for receiving a digital data signal and for providing a first buffered digital data output, the first digital buffer having a first switching threshold voltage; a second digital buffer for receiving the digital data signal and for providing a second buffered digital data output, the second digital buffer having a second switching threshold voltage that is greater than the first predetermined switching threshold voltage; a selection circuit responsive to the first buffered digital data output and the second buffered digital data output for providing a selection circuit output that is a replica of the first buffered digital data output or the second buffered digital data output; and a flip-flop for receiving the selection means output and providing a flip-flop output that is indicative of the logical state of the digital data signal. The selection circuit is controlled by the output of the flip-flop such that the selection circuit output is a replica of the first buffered digital data output when the flip-flop output indicates that the digital data signal is of a first logical state that is represented by a first predetermined voltage, and such that the selection circuit output is a replica of the second buffered digital data output when the flip-flop output indicates that the digital data signal is of a second logical state that is represented by a second predetermined voltage that is greater than the first predetermined voltage.

BRIEF DESCRIPTION OF THE DRAWINGS

The advantages and features of the disclosed invention will readily be appreciated by persons skilled in the art from the following detailed description when read in conjunction with the drawing wherein:

FIG. 1 sets forth a block diagram of a digital input threshold switching circuit in accordance with the invention.

FIG. 2 sets forth a block diagram of a further digital input threshold switching circuit in accordance with the invention.

DETAILED DESCRIPTION OF THE DISCLOSURE

In the following detailed description and in the several figures of the drawing, like elements are identified with like reference numerals.

Referring now to FIG. 1, set forth therein is a block diagram of a digital input threshold switching circuit in accordance with the invention that employs digital signals. In accordance with conventional digital signal processing, a digital signal is a binary signal wherein a first logical state is represented by a first voltage and a second logical state is represented by a second voltage. For example, the first logical state can be a logical 0 or low and is represented by 0 volts; and the second logical state can be a logical 1 or high and is represented by a voltage that is greater than 0 volts. For ease of understanding, the following discussion will be based on foregoing example of the relation between logical states and the voltages that represent such logical states.

The input threshold switching circuit of FIG. 1 includes an input node 11 for receiving a digital INPUT signal. The input of a first non-inverting digital data buffer 13 and the input of a second non-inverting digital data buffer 15 are connected to the input node 11. The output of the first non-inverting digital data buffer 13 provides a first digital buffer output and is connected to the 0 input of a 2-to-1 multiplexer 17, while the output of the second non-inverting digital data buffer 15 provides a second digital buffer output and is connected to the 1 input of the 2-to-1 multiplexer 17. The output of the 2-to-1 multiplexer 17 provides a digital multiplexer output that is a replica of either the output of first the data buffer 13 or the output of the second data buffer 15, depending on the logical state of a control signal applied to a control input of the multiplexer 17. The output of the multiplexer 17 is connected to the D input of a flip-flop 19 having a Q output and a $\overline{Q}$ output. In accordance with conventional flip-flop implementations, the logical signal at $\overline{Q}$ output is the complement of the logical signal at the Q output, and either the Q output or the $\overline{Q}$ output is connected to other circuitry in the digital circuit in which the input switching threshold circuit of FIG. 1 is implemented, or both the Q output and the $\overline{Q}$ output are connected to other circuitry in the digital circuit in which the input switching threshold circuit of FIG. 1 is implemented. The flip-flop 19 is clocked by a clock signal CLK that is provided to the clock input of the flip-flop.

The Q output of the flip-flop 19 is further connected to the control input of the 2-to-1 multiplexer 17. When the Q output of the flip-flop 19 is a logical 0, as represented for example by 0 volts, the output of the 2-to-1 multiplexer 17 is a replica of the first digital buffer output provided by the first digital buffer 13. When the Q output of the flip-flop 19 is a logical 0, as represented for example by a voltage that is greater than 0 volts, the output of the 2-to-1 multiplexer 17 is a replica of the second digital buffer output provided by the second digital buffer 15. In accordance with the invention, the first buffer 13 has a threshold switching voltage that is lower that the threshold switching voltage of the second buffer 15. As is conventionally known, the relation between the voltage of the input to a digital buffer and the threshold switching voltage of the buffer determines whether the output of the buffer is at a voltage that represents one logical state or at a voltage that represents the other logical state. In particular, if the input signal to a buffer is below the threshold switching voltage, the output of the buffer is at the lower of the two voltages that represent a logical 0 and a logical 1, for example 0 volts. If the input to a buffer is above the threshold switching voltage, the output of the buffer is at the higher of the two voltages that represent a logical 0 and a logical 1.

Pursuant to the dual buffers 13, 15 and the multiplexer 17, the most recently received logical state of the INPUT signal as indicated or represented by the Q output of the flip-flop 19 is utilized to control the switching threshold for the next logical state of the INPUT signal so as to facilitate complete switching to the logical state that is the complement of the most recently received logical state of the INPUT signal. In other words, if the most recently received logical state of the INPUT signal is a logical 0, as indicated by a flip-flop output that is a logical 0, the output of the multiplexer is a replica of the output of the first digital buffer 13 which has a lower switching threshold voltage than the second digital buffer 15. If the most recently received logical state of the INPUT signal is a logical 1, as indicated by a flip-flop output that is a logical 1, the output of the multiplexer 17 is a replica of the output of the second digital buffer 15 which has a higher switching threshold voltage than the first digital buffer 13. Thus, one of the buffers 13, 15 is selected, and the buffer that is selected is that buffer which has a switching threshold voltage that is closer to the voltage that represents the most recently received logical state of the INPUT signal, and the voltage swing required by the input threshold switching circuit to recognize a change from the last received logical state of the INPUT signal is reduced.

In particular, when the most recently received logical state of the INPUT signal is a logical 1, as indicated by a flip-flop output that is a logical 1, the selected digital buffer is the second digital buffer 15 which has a higher switching threshold voltage than the first digital buffer 13. Since the second digital buffer 15 has a higher switching threshold than the first digital buffer 13, the difference between the voltage that represents a logical 1 and the switching threshold of the second digital buffer 15 is less than the difference between the voltage that represents a logical 1 and the switching threshold of the first digital buffer 13. Thus, the amount of voltage drop of the input signal required for the second digital buffer 15 to recognize a change from logical 1 is less than the amount of voltage drop of the input signal required for the first digital buffer 13 to recognize a change from logical 1. The second digital buffer 15 therefore changes to a logical 0 more quickly than the first digital buffer 13. Moreover, due to the higher switching threshold voltage, the second digital buffer 15 is less likely to be driven back to logical 1 state by noise.

When the most recently received logical state of the INPUT signal is a logical 0, as indicated by a flip-flop output that is a logical 0, the selected digital buffer is the first digital buffer 13 which has a lower switching threshold voltage than the second digital buffer 15. Since the first digital buffer 13 has a lower switching threshold than the second digital buffer 15, the difference between the voltage that red, resents a logical 0 and the switching threshold of the first digital buffer 13 is less than the difference between the voltage that represents a logical 0 and the switching threshold of the second digital buffer 15. Thus, the amount of voltage increase of the input signal required for the first digital buffer 13 to recognize a change from logical 0 is less than the amount of voltage increase of the input signal required for the second digital buffer 15 to recognize a change from logical 0. The first digital buffer 13 therefore changes to a logical 1 more quickly than the than the second digital buffer 15. Moreover, due to the lower switching threshold voltage, the first digital buffer 15 is less likely to be driven back to logical 0 state by noise.

It should be appreciated that the circuit of FIG. 1 can be modified to utilize the $\overline{Q}$ output of the flip-flop 19 to control the multiplexer 17. The Q output of the flip-flop 19 is the complement or inverse of the most recently received state of the INPUT signal, and the buffers connected to the inputs of the multiplexer would be configured such that the input buffer connected to the 0 input of the multiplexer 17 would have a higher switching threshold than the buffer connected to the 1 input of the multiplexer 17.

Referring now to FIG. 2, set forth therein is a schematic block diagram of another example of an input threshold switching circuit in accordance with the invention. The circuit of FIG. 2 includes a first inverting digital data buffer 113 and a second inverting digital data buffer 115 having inputs connected to an input node 111 which receives a digital INPUT signal. The output of the first inverting digital data buffer 113 provides a first digital buffer output having a logical state that is the complement of the logical state of the INPUT signal, and is connected to the 0 input of a 2-to-1 multiplexer 117. The output of the second inverting digital data buffer 115 provides a second inverting digital buffer output having a logical state that is complement of the logical state of the INPUT signal, and is connected to the 1 input of the 2-to-1 multiplexer 117. The output of the 2-to-1 multiplexer 117 provides a digital multiplexer output that is a replica of either the output of the first inverting digital data buffer 113 or the output of the second inverting digital data buffer 115, depending on the logical state of a control signal applied to a control input of the multiplexer 117. The output of the multiplexer 117 is connected to the D input of a flip-flop 119 having a Q output and a $\overline{Q}$ output. In accordance with conventional flip-flop implementations, the logical signal at $\overline{Q}$ output is the complement of the logical signal at the Q output, and either the Q output or the $\overline{Q}$ output is connected to other circuitry in the digital circuit in which the input switching threshold circuit of FIG. 2 is implemented, or both the Q output and the $\overline{Q}$ output are connected to other circuitry in the digital circuit in which the input switching threshold circuit of FIG. 2 is implemented. The flip-flop 119 is clocked by a clock signal CLK that is provided to the clock input of the flip-flop 119.

The $\overline{Q}$ output of the flip-flop 119 is further connected to the control input of the 2-to-1 multiplexer 117. When the $\overline{Q}$ output of the flip-flop 119 is a logical 0, as represented for example by 0 volts, the output of the 2-to- 1 multiplexer 117 is a replica of the output provided by the first inverting digital buffer 113. When the $\overline{Q}$ output of the flip-flop 119 is a logical 1, as represented for example by a voltage that is greater than 0 volts, the output of the 2-to-1 multiplexer 117 is a replica of the second inverting digital buffer output provided by the second inverting digital buffer 115. In accordance with the invention, the first inverting digital buffer 113 has a threshold switching voltage that is lower that the threshold switching voltage of the second inverting buffer 115. As is conventionally known, the relation between the voltage of the input to an inverting digital buffer and the threshold switching voltage of the inverting buffer determines whether the output of the buffer is at a voltage that represents one logical state or at a voltage that represents the other logical state. In particular, if the input signal to an inverting buffer is below the threshold switching voltage, the output of the inverting buffer is at the higher of the two voltages that represent a logical 0 and a logical 1. If the input to an inverting buffer is above the threshold switching voltage, the output of the inverting buffer is at the lower of the two voltages that represent a logical 0 and a logical 1, for example 0 volts.

Pursuant to the dual inverting digital buffers 113, 115 and the multiplexer 117, the most recently received logical state of the INPUT signal as represented by the output of the flip-flop 119 is utilized to control the switching threshold for the next logical state of the INPUT signal so as to facilitate complete switching to the logical state that is the complement of the most recently received logical state of the INPUT signal. In other words, if the most recently received logical state of the INPUT signal is a logical 0, as indicated by a flip-flop $\overline{Q}$ output that is a logical 0, the output of the multiplexer 117 is a replica of the output of the first inverting digital buffer 113 which has a lower switching threshold voltage than the second inverting digital buffer 115. If the most recently received logical state of the INPUT signal is a logical 1, as indicated by a flip-flop $\overline{Q}$ output that is a logical 1, the output of the multiplexer 117 is a replica of the output of the second inverting digital buffer 115 which has a higher switching threshold voltage than the first inverting digital buffer 113. Thus, one of the inverting digital buffers 113,115 is selected, and the inverting buffer that is selected is that inverting buffer which has a switching threshold voltage that is closer to the voltage that represents the most recently received logical state of the INPUT signal, and the voltage swing required by the input threshold switching circuit to recognize a change from the last received logical state of the INPUT signal is reduced.

In particular, when the most recently received logical state of the INPUT signal is a logical 1, as indicated by a flip-flop $\overline{Q}$ output that is a logical 1, the selected digital buffer is the second inverting digital buffer 115 which has a higher switching threshold voltage than the first inverting digital buffer 113. Since the second inverting digital buffer 115 has a higher switching threshold than the first inverting digital buffer 113, the difference between the voltage that represents a logical 1 and the switching threshold of the second inverting digital buffer 115 is less than the difference between the voltage that represents a logical 1 and the switching threshold of the first inverting digital buffer 113. Thus, the amount of voltage drop of the input signal required for the second inverting digital buffer 115 to recognize a change from logical 1 is less than the amount of voltage drop of the input signal required for the first inverting digital buffer 113 to recognize a change from logical 1. The second inverting digital buffer 115 therefore changes to a logical 0 more quickly than the first inverting digital buffer 113. Moreover, due to the higher switching threshold voltage, the second inverting digital buffer 115 is less likely to be driven back to logical 1 state by noise.

When the most recently received logical state of the INPUT signal is a logical 0, as indicated by a flip-flop $\overline{Q}$ output that is a logical 0, the selected digital buffer is the first inverting digital buffer 113 which has a lower switching threshold voltage than the second inverting digital buffer 115. Since the first inverting digital buffer 113 has a lower switching threshold than the second inverting digital buffer 115, the difference between the voltage that represents a logical 0 and the switching threshold of the first inverting digital buffer 113 is less than the difference between the voltage that represents a logical 0 and the switching threshold of the second inverting digital buffer 115. Thus, the amount of voltage increase of the input signal required for the first inverting digital buffer 113 to recognize a change from logical 0 is less than the amount of voltage increase of the input signal required for the second inverting digital buffer 115 to recognize a change from logical 0. The first inverting digital buffer 113 therefore changes to a logical 1 more quickly than the than the second inverting digital buffer 115. Moreover, due to the lower switching threshold voltage, the first digital buffer 115 is less likely to be driven back to logical 0 state by noise.

It should be appreciated that the circuit of FIG. 2 can be modified to utilize the Q output of the flip-flop 119 to control the multiplexer 117. The Q output of the flip-flop 119 is the complement or inverse of the most recently received state of the INPUT signal, and the inverting buffers connected to the inputs of the multiplexer would be configured such that the inverting input buffer connected to the 0 input of the multiplexer 117 would have a higher switching threshold than the inverting buffer connected to the 1 input of the multiplexer 117.

Thus, an input threshold switching circuit in accordance with the invention clocks into a flip-flop a logical signal that is indicative or representative of the most recent state of the INPUT signal and provides a flip-flop output that is indicative of the most recently received state of the INPUT signal. Such flip-flop output is utilized to control the switching threshold of the input threshold switching circuit so as to reduce the voltage swing required for the input threshold switching circuit to recognize a change from the most recently received state of the INPUT signal.

From the foregoing it should be appreciated that since the switching threshold of an input threshold switching circuit in accordance with the invention is selected to reduce the voltage swing required for the input threshold switching circuit to recognize a change from the most recently received state of the INPUT signal provided to the input threshold switching circuit, a weaker driver can be utilized for driving the INPUT signal without sacrificing signal switching speed. Moreover, although there is some loss in noise margin at the input, there is no increase in susceptibility to noise since the threshold is changed synchronously pursuant to active clock edges that occur after the INPUT signal has stabilized. Still further, the use of a weaker driver reduces induced noise.

Although the foregoing has been a description and illustration of specific embodiments of the invention, various modifications and changes thereto can be made by persons skilled in the art without departing from the scope and spirit of the invention as defined by the following claims.

What is claimed is:

1. A digital input threshold switching circuit for receiving a digital data signal having a logical state that is one of a first logical state and a second logical state, wherein the first logical state is represented by a first predetermined voltage and the second logical state is represented by a second predetermined voltage that is greater than the first predetermined voltage, comprising:

a first digital buffer having an input for receiving the digital data signal and an output for providing a first buffered digital data output, said first digital buffer having a first switching threshold voltage;

a second digital buffer having an input for receiving the digital data signal and an output for providing a second buffered digital data output, said second digital buffer having a second switching threshold voltage that is greater than said first switching threshold voltage;

selection means having a first input for receiving said first buffered digital data output, a second input for receiving said second buffered digital data output, and an output for providing a selection means output that is a replica of one of said first buffered digital data output and said second buffered digital data output;

a clocked flip-flop having an input for receiving said selection means output and an output for providing a flip-flop output that is indicative of a most recently received logical state of the digital data signal; and wherein said selection means is responsive to said flip-flop output such that said selection means output is a replica of said first buffered digital data output when said flip-flop output indicates that the most recently received logical state of the digital data signal is of the first state that is represented by the first predetermined voltage, and such that said selection means output is a replica of said second buffered digital data output when said flip-flop output indicates that the most recently received logical stage of the digital data signal is of the second state that is represented by the second predetermined voltage that is greater than the first predetermined voltage.

2. The digital input threshold switching circuit of claim 1 wherein said first digital buffer comprises a non-inverting buffer, and wherein said second digital buffer comprises a non-inverting buffer.

3. The digital input threshold switching circuit of claim 1 wherein said first digital buffer comprises an inverting buffer, and wherein said second digital buffer comprises an inverting buffer.

4. The digital input threshold switching circuit of claim 1 wherein said selection means comprises a multiplexer.

5. A digital input threshold switching circuit for receiving a digital data signal having a logical state that is one of a first logical state and a second logical state, wherein the first logical state is represented by a first predetermined voltage and the second logical state is represented by a second predetermined voltage that is greater than the first predetermined voltage, comprising:

a first digital buffer having an input for receiving the digital data signal and an output for providing a first buffered digital data output, said first digital buffer having a first switching threshold voltage;

a second digital buffer having an input for receiving the digital data signal and an output for providing a second buffered digital data output, said second digital buffer having a second switching threshold voltage that is greater than said first switching threshold voltage;

selection means a having first input for receiving said first buffered digital data output, a second input for receiving said second buffered digital data output, and an output for providing a selection means output that is a replica of one of said first buffered digital data output and said second buffered digital data output;

a clocked flip-flop having an input for receiving said selection means output and an output for providing a flip-flop output; and wherein said selection means is responsive to said flip-flop output such that said selection means output is a replica of said first buffered digital data output when said flip-flop output is of the first state that is represented by the first predetermined voltage, and such that said selection means output is a replica of said second buffered digital data output when said flip-flop output is of the second state that is represented by the second predetermined voltage that is greater than the first predetermined voltage.

6. The digital input threshold switching circuit of claim 5 wherein said first digital buffer comprises a non-inverting buffer, and wherein said second digital buffer comprises a non-inverting buffer.

7. The digital input threshold switching circuit of claim 5 wherein said selection means comprises a multiplexer.

* * * * *